United States Patent
Seo et al.

(10) Patent No.: US 7,580,478 B2
(45) Date of Patent: Aug. 25, 2009

(54) I/Q MODULATOR USING CURRENT-MIXING AND DIRECT CONVERSION WIRELESS COMMUNICATION TRANSMITTER USING THE SAME

(75) Inventors: Hae-Moon Seo, Yongin (KR);
Yeon-Kuk Moon, Seoul (KR);
Young-Kuk Park, Yongin (KR);
Kwang-Ho Won, Yongin (KR);
Myung-Hyun Yoon, Sungnam (KR);
Seong-Dong Kim, Daegu (KR)

(73) Assignee: Korea Electronics Technology Institute, Kyunggi-Do (KR)

( * ) Notice: Subject to any disclaimer, the term of this patent is extended or adjusted under 35 U.S.C. 154(b) by 563 days.

(21) Appl. No.: 11/313,616

(22) Filed: Dec. 22, 2005

(65) Prior Publication Data

US 2007/0058751 A1 Mar. 15, 2007

(30) Foreign Application Priority Data

Sep. 13, 2005 (KR) ............... 10-2005-0085063

(51) Int. Cl.
*H03C 3/00* (2006.01)
*H04B 1/26* (2006.01)

(52) U.S. Cl. ............ 375/307; 455/324; 332/117
(58) Field of Classification Search ........... 375/295, 375/296, 297, 302, 303, 306, 307; 455/91, 455/118, 130, 313, 323, 324, 333, 332; 332/103, 332/117, 137, 138; 259/79, 66, 67, 69, 202, 259/204

See application file for complete search history.

(56) References Cited

U.S. PATENT DOCUMENTS

| | | | |
|---|---|---|---|
| 2004/0106380 A1* | 6/2004 | Vassiliou et al. | 455/73 |
| 2004/0214547 A1* | 10/2004 | Kim et al. | 455/296 |
| 2005/0170806 A1* | 8/2005 | Kim | 455/323 |
| 2005/0282510 A1* | 12/2005 | Bang et al. | 455/190.1 |

* cited by examiner

*Primary Examiner*—David C Payne
*Assistant Examiner*—Vineeta S Panwalkar
(74) *Attorney, Agent, or Firm*—Edell, Shapiro & Finnan, LLC

(57) ABSTRACT

The present invention relates to an I/Q modulator using a current-mixing method used for a direct conversion wireless communication transmitter. In accordance with the present invention, an EVM of a wireless communication system, a linearity and a power consumption are improved by converting a D/A converted signal to a current level and then performing a frequency modulation.

8 Claims, 5 Drawing Sheets

(PRIOR ART)

I/Q MODULATOR USING CURRENT-MIXING AND DIRECT CONVERSION WIRELESS COMMUNICATION TRANSMITTER USING THE SAME

RELATED APPLICATIONS

The present disclosure relates to subject matter contained in priority Korean Application No. 10-2005-0085063 filed on 13 Sep. 2005, which is herein expressly incorporated by reference in its entirety.

BACKGROUND OF THE INVENTION

1. Field of the Invention

The present invention relates to an I/Q modulator using current-mixing and a direct conversion wireless communication transmitter using the same, and in particular, to an I/Q modulator using current-mixing and a direct conversion wireless communication transmitter using the same having an improved EVM of a wireless communication system, a linearity and a power consumption wherein a D/A converted signal is converted to a current level and then subjected to a frequency modulation through this to overcome a disadvantage of the conventional wireless communication system using a direct conversion wherein a voltage level is attenuated through a signal attenuation block due to a high voltage level of the D/A converted signal to obtain a high voltage gain in a design of an I/Q modulator which requires a large current consumption.

2. Description of the Related Art

Recently, many researches are carried out to develop a low power one-chip solution for a wireless communication system. Particularly, since a RF transmitter block consumes most of the power in the wireless communication system, an optimization of the RF transmitter block should be given priority to embody the low power one-chip solution.

A generally used transmitter in a conventional wireless communication system employs a superheterodyne type. In accordance with the superheterodyne type a signal of a low frequency band including an actual information such as a voice or an image is converted into a signal of an intermediate frequency and then transmitted using a carrier wave which is a high frequency wave. The superheterodyne type is disadvantageous in that a hardware configuration is very complex and a power consumption is large.

In order to overcome the disadvantage of the conventional superheterodyne type, a direct conversion type wherein a baseband signal is directly up-converted to a carrier wave signal without using the intermediate frequency is being widely used. The direct conversion type is advantageous in that the direct conversion type has the lowest power consumption of wireless communication transmitter structure, and has a low production cost and a miniaturization is possible.

FIG. 1 is a block diagram illustrating an example of the conventional direct conversion wireless communication transmitter. As shown, the conventional direct conversion wireless communication transmitter 100 comprises a digital modulator 110, a D/A converter 120, a signal attenuator 130, a frequency-up I/Q modulator 140 (including an I-modulator 143 and a Q-modulator 146), a poly-phase filter 150, a local oscillator 160, a power amplifier 170 and an antenna 180.

The digital modulator 110 digitally modulates the baseband signal to output an I component and a Q component signals.

The D/A converter 120 converts the I component and the Q component signals which are the output signals of the digital modulator 110 to an I component and a Q component signals of an analog data.

The signal attenuator 130 attenuates a level of the I component and a Q component signals which are the output signals of the D/A converter 120. That is, the I component and the Q component signals includes a signal of high voltage level. Therefore, since there is a linearity problem of the signal when the signal of the high voltage level is directly applied to the frequency-up I/Q modulator 140, the signal is attenuated by the signal attenuator 130 prior to the application.

The local oscillator 160 generates a sinusoidal wave having a frequency of $F_{TX}$. $F_{TX}$ is a frequency of an output signal of the direct conversion wireless communication transmitter 100.

The poly-phase filter 150 receives the sinusoidal wave generated by the local oscillator 160 to generate an output signal having a phase of 0°, 90°, 180°, 270°, for example.

The frequency-up I/Q modulator 140 multiplexes the output signals of the signal attenuator 130 and the poly-phase filter 150.

The power amplifier 170 amplifies the output signal of the frequency-up I/Q modulator 140 to have a desirable magnitude.

The antenna 180 emits the output signal of the power amplifier 170 to an atmosphere.

Although not shown, the conventional direct conversion wireless communication transmitter 100 further comprises a DC matching and analog filter. Generally, the output signal of the D/A converter 120 includes a plurality of harmonic wave signals, and a DC level of the output signal differs from that of the frequency-up I/Q modulator 140. Therefore, the DC matching and analog filter removes the harmonic wave signals and performs a DC matching to match an DC output level of the D/A converter 120 and a DC input level of the frequency-up I/Q modulator 140.

In accordance with the conventional direct conversion structure described with reference to FIG. 1, the signal is converted to a desired carrier frequency through only one frequency up-conversion by the frequency-up I/Q modulator 140. Therefore, a performance of the frequency-up I/Q modulator 140 in a transmitter using the direct conversion structure has a large effect on a characteristic of the entire modulation quality thereof such as a EVM (error vector magnitude), a linearity and power consumption.

FIG. 2 is a configuration diagram illustrating a conventional I/Q frequency up-conversion modulator.

As shown, I/Q signals $V_{IP}$, $V_{IN}$, $V_{QP}$, $V_{QN}$ of the baseband which are the output signals of the signal attenuator 130 and output signals LO0, LO90, LO180, LO270 having phases of 0°, 90°, 180°, 270° which are the output signals of the frequency-up I/Q modulator 140 are applied to the I-modulator 143 and the Q-modulator 146 to generate output signals $V_{ON}$, $V_{ON}$. A load Zload is a load impedance for the output signals $V_{ON}$, $V_{ON}$.

However, as described above, a signal attenuated by the signal attenuator 130 are input to the I-modulator 143 and the Q-modulator 146 in case of the I/Q modulator for the conventional direct conversion type wireless communication transmitter. Therefore, a voltage gain should be increased since the frequency-up I/Q modulator 140 performs a frequency modulation on a signal having an attenuated voltage level. Due to this, a large current consumption is required in order to obtain a high voltage gain during a design of the frequency-up I/Q modulator 140.

Such configuration degrades the linearity which is one of most important characteristics of the frequency-up I/Q modulator 140 even when the attenuated signal is used by the signal attenuator 130. In addition, a relatively large area is required for the design of the frequency-up I/Q modulator 140 to obtain the high voltage gain.

Therefore, a method for improving the important characteristic such as the EVM, the linearity, the power consumption, the modulation quality without using the signal attenuator in a wireless communication system using the direct conversion structure is necessary.

SUMMARY OF THE INVENTION

It is an object of the present invention to provide an I/Q modulator using current-mixing having an improved EVM of a wireless communication system, a linearity and a power consumption wherein a D/A converted signal is converted to a current level and then subjected to a frequency modulation through this to overcome a disadvantage of the conventional wireless communication system using a direct conversion wherein a voltage level is attenuated through a signal attenuation block due to a high voltage level of the D/A converted signal to obtain a high voltage gain in a design of an I/Q modulator which requires a large current consumption.

It is another object of the present invention to provide a direct conversion wireless communication transmitter using the same using an I/Q modulator using current-mixing.

In order to achieve the above-described objects of the present invention, there is provided an I/Q modulator using a current-mixing method used for a direct conversion wireless communication transmitter, the modulator comprising: one or more voltage-to-current converters for receiving a digitally modulated and D/A converted signal of a voltage level and for converting the signal of the voltage level to a signal of a current level to be output; one or more current sources for providing a predetermined current; a local signal providing unit for providing a local signal having one or more phases; and one or more frequency mixing units for mixing a signal to be modulated and the local signal having the one or more phases, the signal to be modulated being a difference between the predetermined current provided by one or more current sources and the signal of the current level.

In accordance with I/Q the modulator of the present invention, I/Q the modulator may further comprise one or more DC matching and filtering units for removing a harmonic signal component of the signal of the voltage level which is an input signal of the one or more voltage-to-current converters and for matching a DC level of the signal of the voltage level to a DC level of the frequency matching unit.

In accordance with I/Q the modulator of the present invention, the voltage-to-current converters may determine a value of the current level according to a transconductance of the one or more frequency mixing units.

In order to achieve the above-described objects of the present invention, there is provided a direct conversion wireless communication transmitter, comprising: a digital modulating unit for outputting an I component and a Q component signals by digitally modulating a baseband signal; a D/A converting unit for converting the I component and the Q component signals to an I component and a Q component signals of an analog data; an I/Q modulator using a current-mixing method in accordance with one of claims 1 through 3; a power amplifying unit for amplifying an output signal of the I/Q modulator to an output signal having a predetermined magnitude; and an antenna for emitting the output signal having the predetermined magnitude of the power amplifying unit into an atmosphere.

DETAILED DESCRIPTION OF THE INVENTION

An I/Q modulator using current-mixing method and a direct conversion wireless communication transmitter using the same in accordance with the present invention will now be described in detail with reference to the accompanied drawings.

Figure 3:
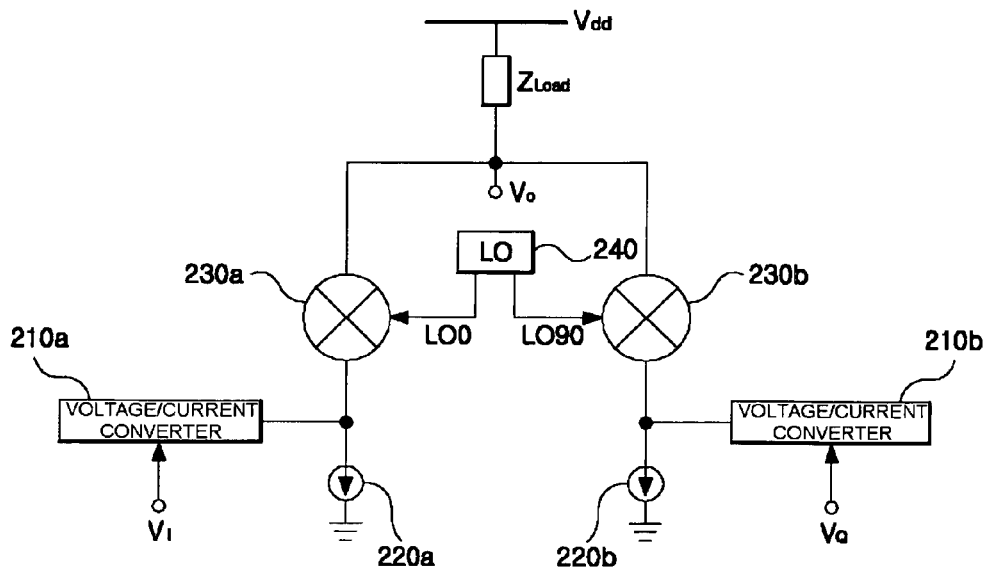
FIG. 3 is a configuration diagram illustrating an I/Q modulator using current-mixing method in accordance with a first embodiment of the present invention.

FIG. 3 is a configuration diagram illustrating an I/Q modulator using current-mixing method in accordance with a first embodiment of the present invention. As shown, I/Q modulator in accordance with the first embodiment comprises voltage-to-current converters 210a and 210b, current sources 220a and 220b, and frequency mixing units 230a and 230b, and a local signal providing unit (not shown).

The voltage-to-current converters 210a and 210b receives a signal of a voltage level and then convert the same to a signal of a current level to be output.

Figure 1:
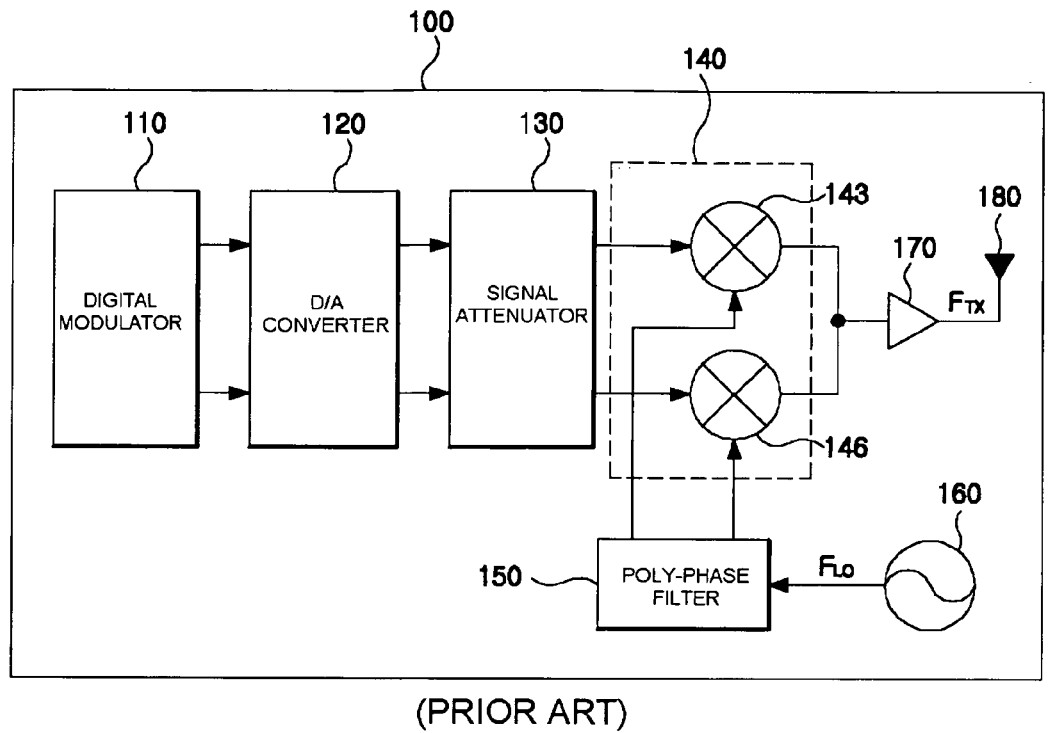
FIG. 1 is a block diagram illustrating a conventional direct conversion wireless communication transmitter.
Figure 2:
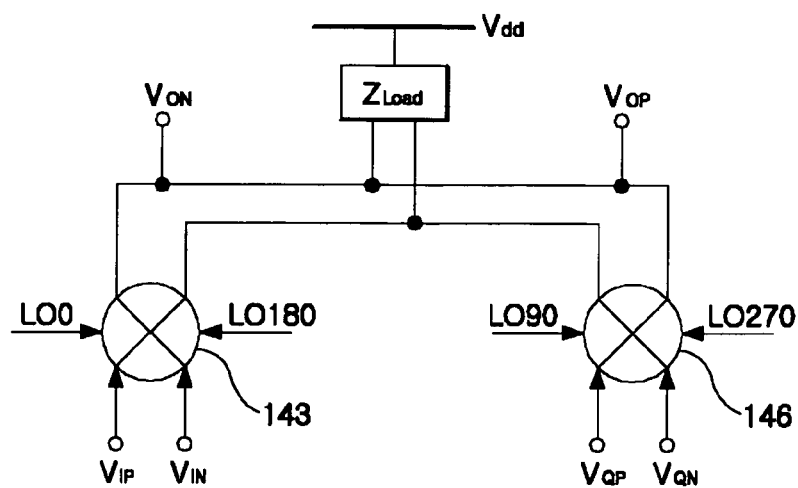
FIG. 2 is a configuration diagram illustrating a conventional I/Q frequency up-conversion modulator.

As shown in FIG. 1, an I component and a Q component signals which are analog data are input to the voltage-to-current converters. Since a voltage level of the I component and the Q component signals are very high, a linearity is reduced when the I component and the Q component signals are input directly into the frequency mixing units 230a and 230b. Therefore, the signals having a high voltage level are converted into signals having a current level. A value of the current level may be determined, for example, according to a transconductance of the frequency mixing units 230a and 230b.

The current sources 220a and 220b provide a predetermined current.

The local signal providing unit (not shown) provides a local signal having one or more phases. For example, in accordance with the example described in FIG. 3, local signals L00 and L090 having a 0° and 90° phases are provided.

The frequency mixing units 230a and 230b modulates a frequency using the local signals L00 and L090 provided by the local signal providing unit. In this case, an input signal of the frequency mixing units 230a and 230b is a difference between the predetermined current provided by the current sources 220a and 220b and the output signal of the voltage-to-current converters 210a and 210b.

That is, the I/Q modulator of the present invention differs from the conventional one in that the signal is converted to the signal of the current level by the voltage-to-current converters 210a and 210b and then the signal corresponding to the difference between the signal of the current level and the current of the current sources 220a and 220b is input to the frequency mixing units 230a and 230b in accordance with the I/Q modulator of the present invention while the signal of the voltage level is directly applied to the frequency mixing units in accordance with the conventional I/Q modulator.

Particularly, such configuration eliminates a need for a circuit used for a signal attenuation so as to facilitate a design of the I/Q modulator and to improve a modulation characteristic such as a power consumption and a linearity. In addition, the signal converted to have the current level is used so as to be suitable for the transconductance of the frequency mixing units 230a and 230b, thereby the output voltage Vo is determined to have a desired level.

Figure 4:
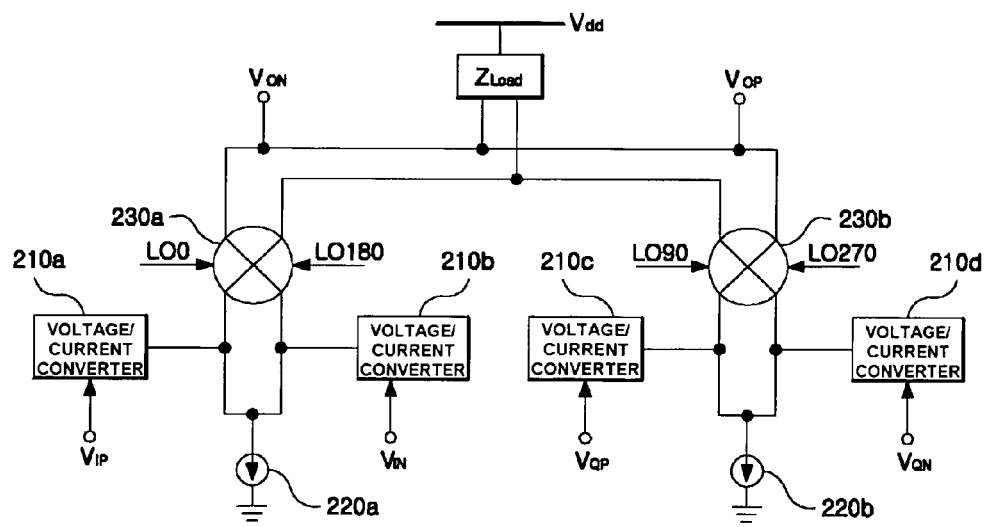
FIG. 4 is a configuration diagram illustrating an I/Q modulator using current-mixing method in accordance with a second embodiment of the present invention.

FIG. 4 is a configuration diagram illustrating an I/Q modulator using current-mixing method in accordance with a second embodiment of the present invention.

While the I/Q modulator described with reference to FIG. 3 is a single type modulator, the I/Q modulator described with reference to FIG. 4 is a differential type modulator.

Particularly, the I/Q modulator illustrated in FIG. 4 has a configuration for a common mode noise rejection during a design of an integrated circuit.

Figure 5:
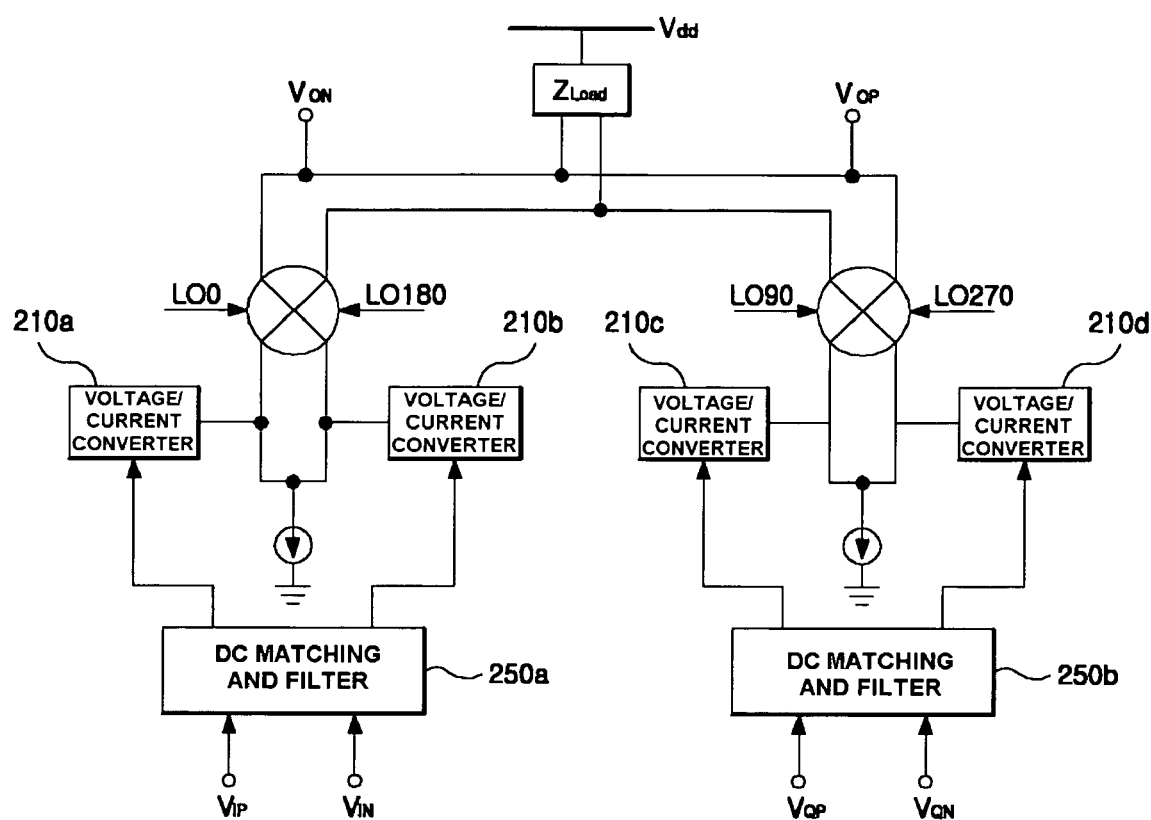
FIG. 5 is a configuration diagram illustrating an I/Q modulator using current-mixing method in accordance with a third embodiment of the present invention.

On the other hand, the I/Q modulator may further comprise a DC matching and harmonic wave filtering configuration. FIG. 5 is a configuration diagram illustrating an I/Q modulator using current-mixing method in accordance with a third embodiment of the present invention.

As shown, after input voltages $V_{IP}$, $V_{IN}$, $V_{QP}$ and $V_{QN}$ are processed by DC matching and filtering units 250a and 250b, the input voltages are applied to voltage-to-current converters 210a, 210b, 210c and 210d. This configuration simplifies a configuration of a direct conversion wireless communication transmitter because a separate configuration for DC matching and harmonic filtering is not required and the configuration may be built in the I/Q modulator. Other configuration elements are identical to the second embodiment described with reference to FIG. 4, thereby omitted.

In addition, although FIG. 5 illustrates the configuration wherein the DC matching and filtering units 250a and 250b are added to the differential type modulator, the DC matching and filtering units may be added to the single type modulator.

Figure 6:
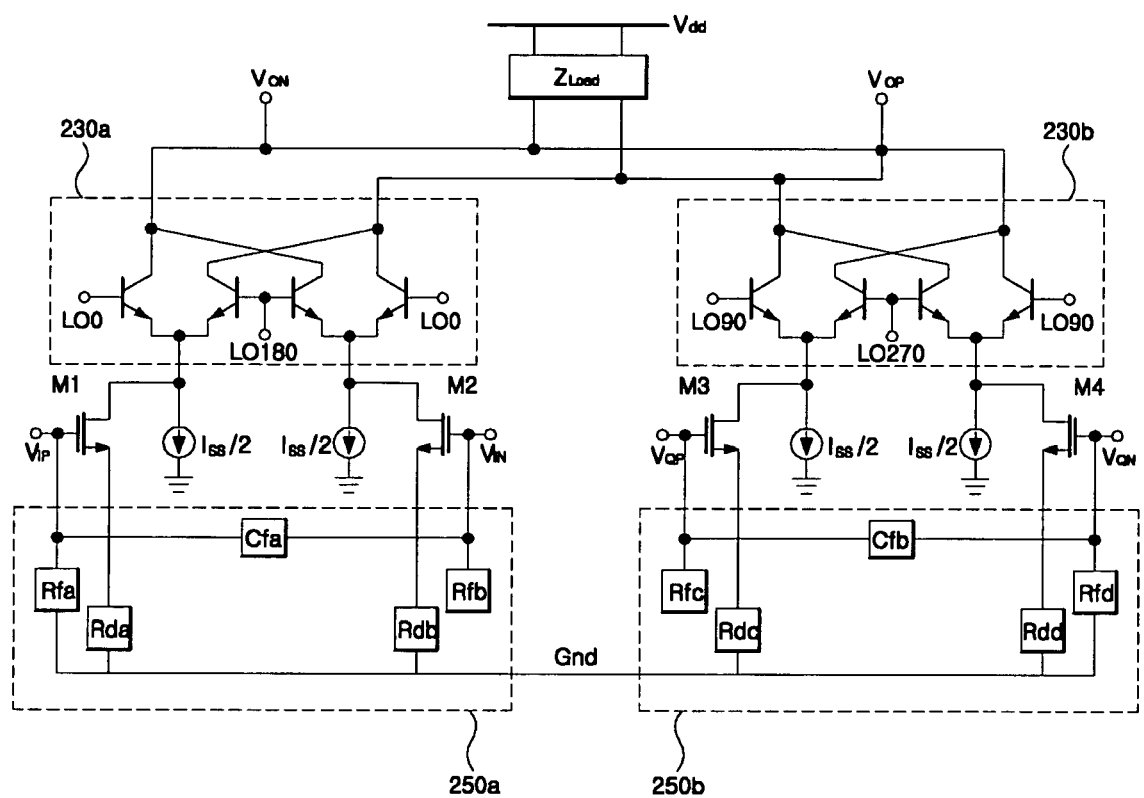
FIG. 6 is a diagram illustrating a circuit embodiment of the I/Q modulator using current-mixing method in accordance with the present invention.

FIG. 6 is a diagram exemplifying a circuit embodiment of the I/Q modulator in accordance with the present invention, wherein a BiCMOS process technology is employed.

MOS transistors M1 through M4 of FIG. 6 operates as voltage-to-current converters for converting input voltages $V_{IP}$, $V_{IN}$, $V_{QP}$ and $V_{QN}$ into a current level. Currents generated by the MOS transistors M1 through M4 is connected to a current source Iss/2 to generate a signal being input to frequency mixing units 230a and 230b. Input signals L00, L0180, L090 and L0270 to base terminals of the frequency mixing units 230a and 230b are local signals having phases of 0°, 180°, 90° and 270°. In addition, $V_{ON}$ and $V_{OP}$ are output signals of the frequency mixing units 230a and 230b, which are amplified at a power amplifying unit to output signals having a desired magnitude.

In addition, resistors Rfa through Rfd and Rda through Rdd and condensers Cfa through Cfb operate as a filter for DC matching and filtering harmonic wave, i.e., a DC matching and filtering units 250a and 250b.

Figure 7:
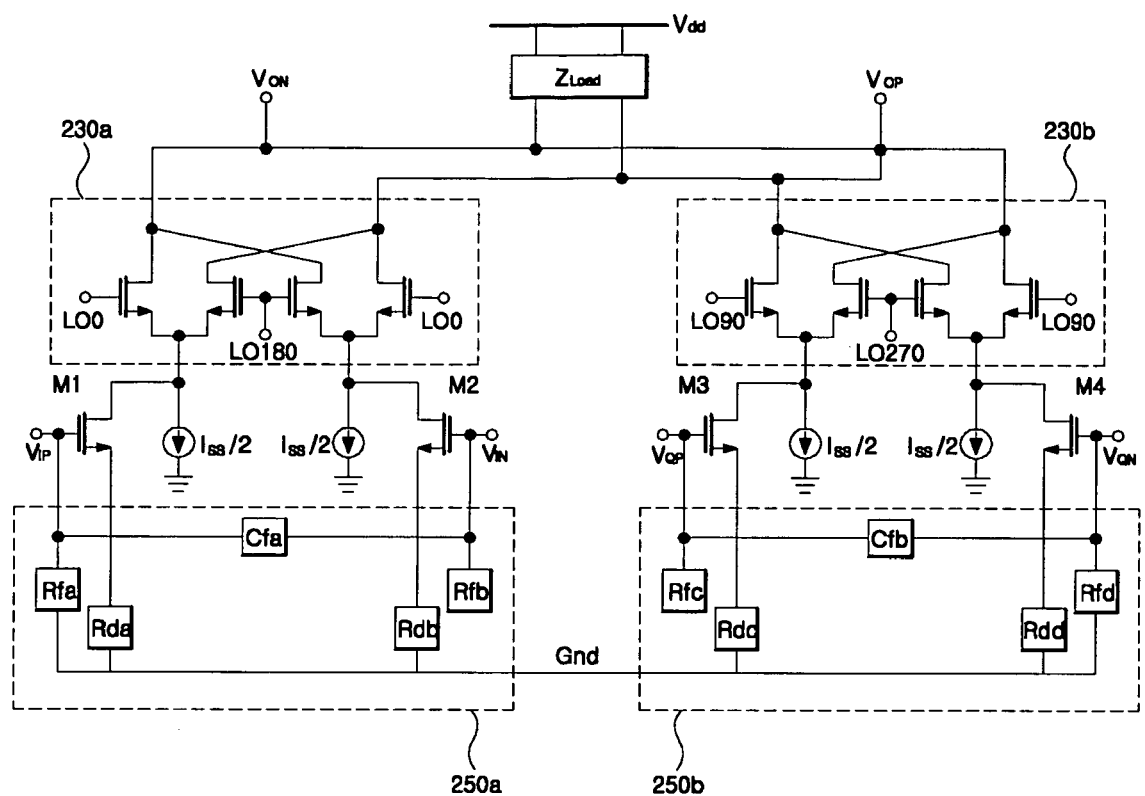
FIG. 7 is a diagram illustrating another circuit embodiment of the I/Q modulator using current-mixing method in accordance with the present invention.

FIG. 7 is a diagram exemplifying another circuit embodiment of the I/Q modulator in accordance with the present invention, wherein a CMOS process technology is employed.

The circuit embodiment of the I/Q modulator shown in FIG. 7 differs from that of FIG. 6 in that MOS transistors are used to embody frequency mixing units 230a and 230b instead of bipolar transistors, and operations of other components are the same as that of FIG. 6, thereby omitted.

On the other hand, although not shown, a direct conversion wireless communication transmitter may be embodied using the I/Q modulator in accordance with the present invention. That is, the direct conversion wireless communication transmitter may be embodied by removing the signal attenuation unit 130 from the conventional direct conversion wireless communication transmitter shown in FIG. 1 and connecting the I/Q modulator of the present invention to the D/A converting unit 120. Particularly, since the I/Q modulator in accordance with the present invention may comprise the DC matching and filtering units, the entire configuration of the direct conversion wireless communication transmitter may be simplified and one chip embodiment is facilitated.

While the present invention has been particularly shown and described with reference to the preferred embodiment thereof, it will be understood by those skilled in the art that various changes in form and details may be effected therein without departing from the spirit and scope of the invention as defined by the appended claims.

As described above, in accordance with the present invention, an EVM of a wireless communication system, a linearity and a power consumption are improved by converting a D/A converted signal to a current level and then performing a frequency modulation through this to overcome a disadvantage of the conventional wireless communication system using a direct conversion wherein a voltage level is attenuated through a signal attenuation block due to a high voltage level of the D/A converted signal to obtain a high voltage gain in a design of an I/Q modulator which requires a large current consumption.

What is claimed:

1. An I/Q modulator that employs current-mixing for a direct conversion wireless communication transmitter, the modulator comprising:

one or more voltage-to-current converters for receiving a digitally modulated and D/A converted voltage level signal and for convening the voltage level signal to a current level signal to be output;

one or more current sources for providing a predetermined current, each of the voltage-to-current converters comprising a CMOS transistor connected in parallel with a corresponding one of the one or more current sources between a common node and ground, a gate of the CMOS transistor receiving the voltage level signal, wherein a signal to be modulated is provided at the common node as a difference between the predetermined current provided by the corresponding one of the one or more current sources and the current level signal;

a local signal providing unit for providing a local signal having one or more phases; and one or more frequency mixing units for mixing the local signal having the one or more phases and the signal to be modulated provided at the common node of a corresponding one of the one or more current sources and a corresponding one of the one or more voltage-to-current converters.

2. The modulator in accordance with claim 1, further comprising one or more DC matching and filtering units for removing a harmonic signal component of the voltage level signal which is an input signal of the one or more voltage-to-current converters and for matching a DC level of the voltage level signal to a DC level of the frequency matching unit.

3. The modulator in accordance with claim 1, wherein the one or more voltage-to-current converters determine a value of the current level according to a transconductance of the one or more frequency mixing units.

4. A direct conversion wireless communication transmitter, comprising:
a digital modulating unit for outputting an I component and a Q component signals by digitally modulating a baseband signal;
a D/A converting unit for converting the I component and the Q component signals to an I component and a Q component signals of an analog data;
an I/Q modulator employing current-mixing in accordance with one of claims 1 through 3;
a power amplifying unit for amplifying an output signal of the I/Q modulator to an output signal having a predetermined magnitude; and
an antenna for emitting the output signal having the predetermined magnitude of the power amplifying unit into an atmosphere.

5. The modulator in accordance with claim 1, wherein each of the voltage-to-current converters consists of a CMOS transistor.

6. The modulator in accordance with claim 1, wherein:
the one or more voltage-to-current converters include at least first and second voltage-to-current converters;
the one or more current sources include at least first and second current sources;
the first voltage-to-current converter comprises a first CMOS transistor connected in parallel with the first current source between a first common node and ground, a gate of the first CMOS transistor receiving a first voltage level signal, a first terminal of the first CMOS transistor being coupled to the first common node, and a second terminal of the first CMOS transistor being coupled to ground;
the second voltage-to-current converter comprises a second CMOS transistor connected in parallel with the second current source between a second common node and ground, a gate of the second CMOS transistor receiving a second voltage level signal, a first terminal of the second CMOS transistor being coupled to the second common node, and a second terminal of the second CMOS transistor being coupled to ground; and
the one or more frequency mixing units comprise at least a first frequency mixing unit, the first and second common nodes being coupled to the first frequency mixing unit;
wherein the modulator further comprises:
a first resistor coupled between the gate of the first CMOS transistor and ground;
a second resistor coupled between the second terminal of the first CMOS transistor and ground;
a third resistor coupled between the gate of the second CMOS transistor and ground;
a fourth resistor coupled between the second terminal of the second CMOS transistor and ground; and
a first capacitor coupled between the gates of the first and second CMOS transistors.

7. The modulator in accordance with claim 6, wherein:
the one or more voltage-to-current converters further include third and fourth voltage-to-current converters;
the one or more current sources further include third and fourth current sources;
the third voltage-to-current converter comprises a third CMOS transistor connected in parallel with the third current source between a third common node and ground, a gate of the third CMOS transistor receiving a third voltage level signal, a first terminal of the third CMOS transistor being coupled to the third common node, and a second terminal of the third CMOS transistor being coupled to ground;
the fourth voltage-to-current converter comprises a fourth CMOS transistor connected in parallel with the fourth current source between a fourth common node and ground, a gate of the fourth CMOS transistor receiving a fourth voltage level signal, a first terminal of the fourth CMOS transistor being coupled to the fourth common node, and a second terminal of the fourth CMOS transistor being coupled to ground; and
the one or more frequency mixing units further comprise a second frequency mixing unit, the third and fourth common nodes being coupled to the second frequency mixing unit;
wherein the modulator further comprises:
a fifth resistor coupled between the gate of the third CMOS transistor and ground;
a sixth resistor coupled between the second terminal of the third CMOS transistor and ground;
a seventh resistor coupled between the gate of the fourth CMOS transistor and ground;
an eighth resistor coupled between the second terminal of the fourth CMOS transistor and ground; and
a second capacitor coupled between the gates of the third and fourth CMOS transistors.

8. The modulator in accordance with claim 1, wherein the one or more frequency mixing units comprise bipolar transistors.

* * * * *